United States Patent
Sugano et al.

[11] 4,015,893
[45] Apr. 5, 1977

[54] COMPOUND SEMICONDUCTOR OPTICAL INTEGRATED CIRCUIT HAVING ISOLATION ZONES FOR LIGHT TRANSMISSION

[75] Inventors: Takuo Sugano, Tokyo; Yoshifumi Mori, Ichikawa, both of Japan

[73] Assignee: Kentaro Hayashi, President, University of Tokyo, Tokyo, Japan

[22] Filed: Aug. 25, 1975

[21] Appl. No.: 607,855

Related U.S. Application Data

[62] Division of Ser. No. 403,303, Oct. 3, 1973, abandoned.

[30] Foreign Application Priority Data

Oct. 12, 1972  Japan .............................. 47-102280

[52] U.S. Cl. .................... 350/96 WG; 350/96 GN
[51] Int. Cl.² ......................................... G02B 5/14
[58] Field of Search ................ 350/96 WG, 96 GN

[56] References Cited

UNITED STATES PATENTS

| | | | |
|---|---|---|---|
| 3,666,548 | 5/1972 | Brack et al. | 117/212 |
| 3,922,062 | 11/1975 | Uchida | 350/96 |

Primary Examiner—John K. Corbin
Assistant Examiner—Stewart Levy
Attorney, Agent, or Firm—Sughrue, Rothwell, Mion, Zinn & Macpeak

[57] ABSTRACT

An isolation zone for light transmission is formed in a compound semiconductor optical integrated circuit by selective oxidation of a compound semiconductor surface by oxygen plasma.

1 Claim, 6 Drawing Figures

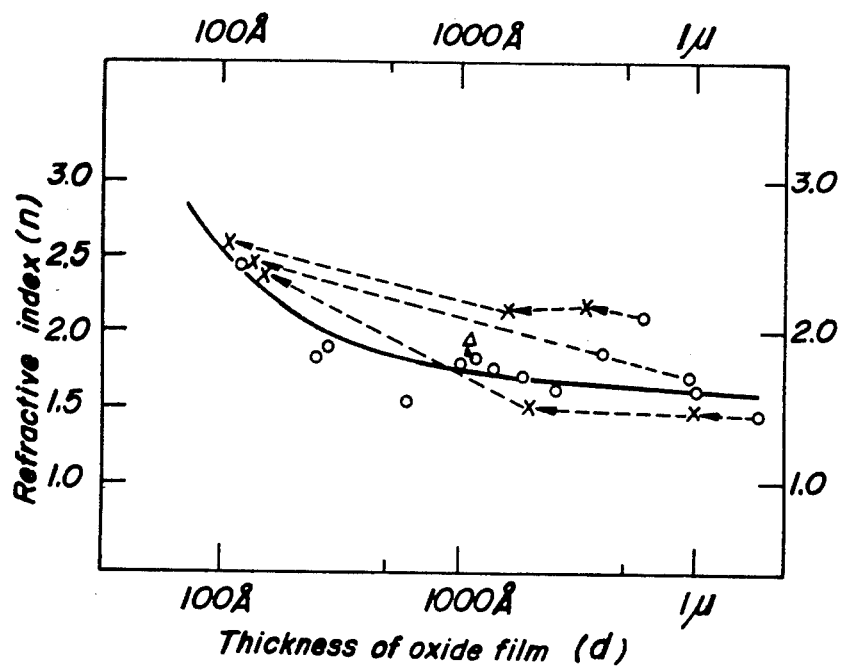

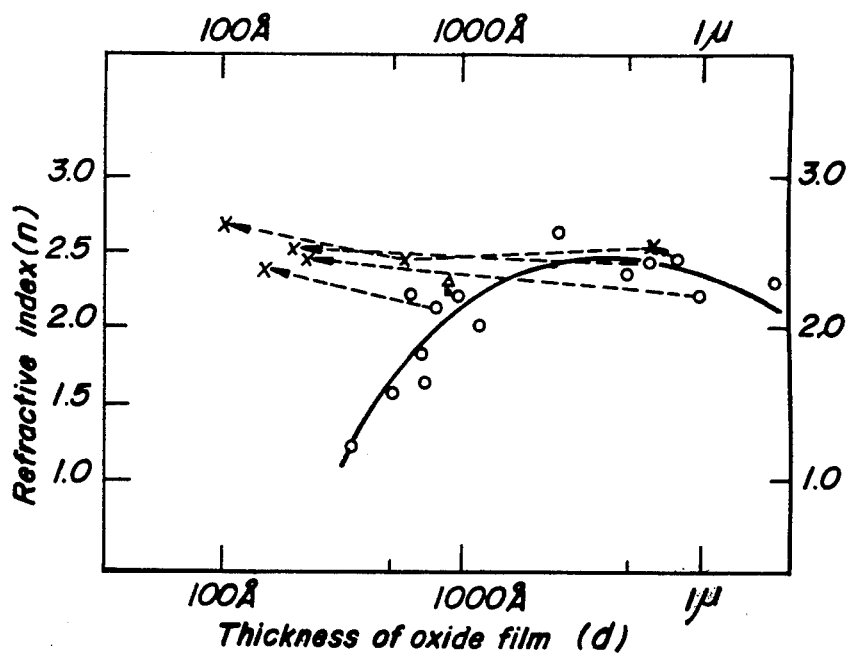

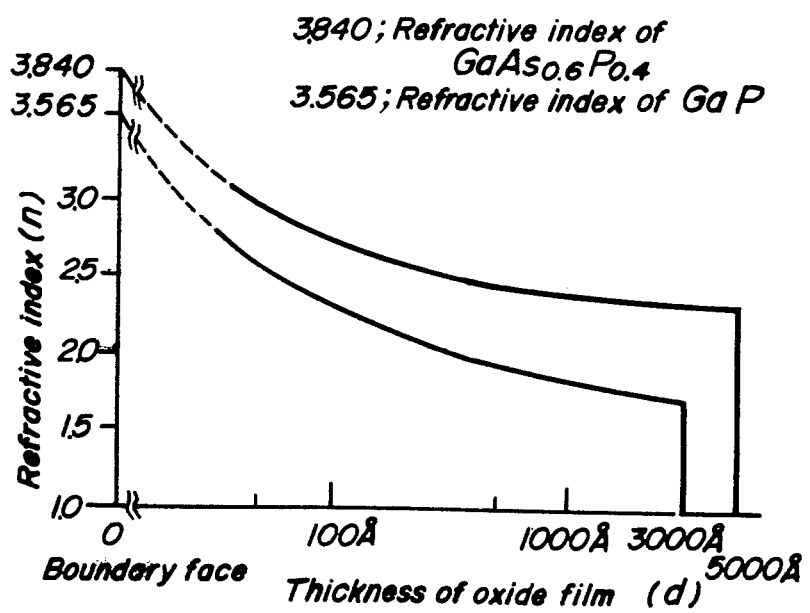
FIG_3
3,840; Refractive index of GaAs$_{0.6}$P$_{0.4}$
3.565; Refractive index of GaP FIG_4a
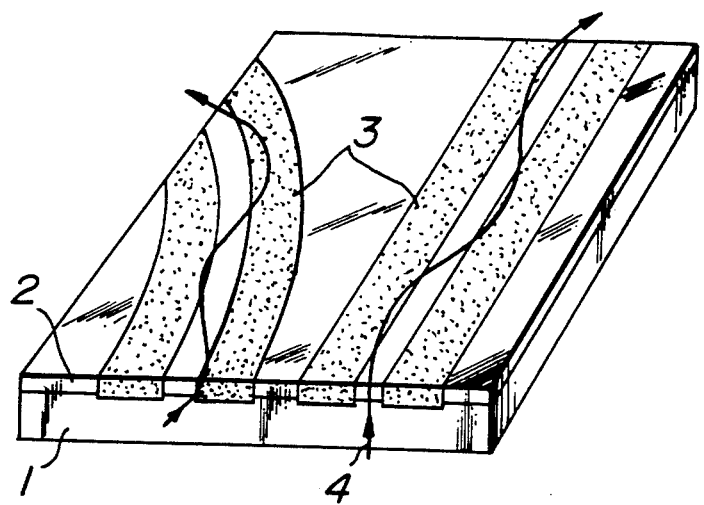
FIG_4b
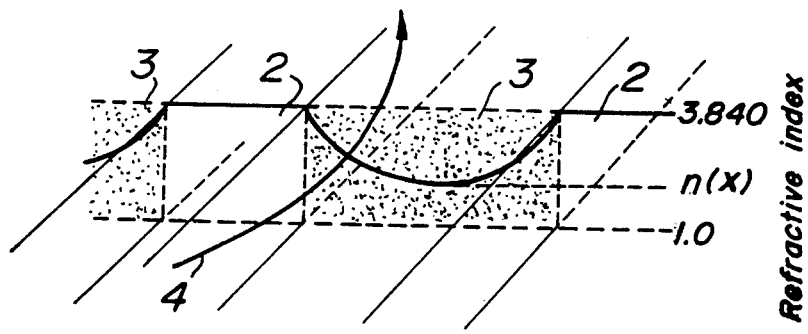
FIG_4c
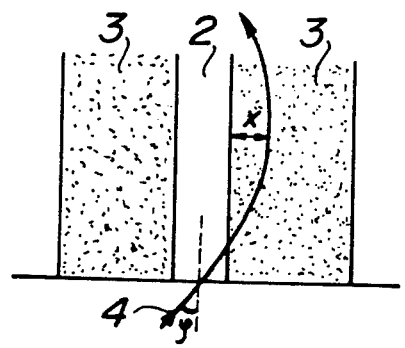

4,015,893

COMPOUND SEMICONDUCTOR OPTICAL INTEGRATED CIRCUIT HAVING ISOLATION ZONES FOR LIGHT TRANSMISSION

CROSS-REFERENCE TO RELATED APPLICATIONS

This is a Division of Application Ser. No. 403,303, filed Oct. 3, 1973, now abandoned. The present invention is related to an invention disclosed in U.S. patent application Ser. No. 508,606, filed Sept. 23, 1974, by Takuo Sugano and Yoshifuni Mori for "Method of Formation of an Insulating Film on a Compound Semiconductor Surface Using Electric Discharge", a Continuation of U.S. patent application Ser. No. 293,902, filed Oct. 2, 1972, now abandoned, and assigned to a common assignee with this Application.

BACKGROUND OF THE INVENTION

1. Field of the Invention

This invention relates to a method of forming isolation zones for light transmission in a compound semiconductor optical integrated circuit.

2. Description of the Prior Art

It is theoretically known that when a light is transmitted between two substances having different refractive indexes, the light is focused in one substance having a refractive index higher than that of another substance and propagated in a longitudinal direction by repeated total reflections at a boundary face between both the substances. Therefore, various attempts have been made in order to obtain light transmission paths in a compound semiconductor substrate; for instance, transparent band-shaped bodies having a higher or lower refractive index are formed in a transparent substrate having a certain refractive index, whereby the substance having the more higher refractive index is used as the light transmission path. However, a satisfactory result is not yet obtained.

SUMMARY OF THE INVENTION

Accordingly, an object of the invention is to successfully realize the above described theory and to provide a method of forming isolation zones for light transmission in a compound semiconductor optical integrated circuit.

The above objects are accomplished by a method of forming isolation zones for light transmission in a compound semiconductor optical integrated circuit which comprises providing, as the isolation zones, oxide films in a given pattern on the compound semiconductor surface by plasma oxidation. According to the present invention, the oxide film can selectively be formed on the compound semiconductor surface by plasma oxidation. The thickness of the thus formed plasma oxide film is of the order of 10 microns at maximum. The refractive index of the plasma oxide film is different from the refractive index of the substrate of the compound semiconductor and gradually decreases from the boundary face between the substrate and the film toward the outer surface of the film. The present invention is achieved by utilizing the above described phenomenon of the plasma oxide film; that is, the oxide film is used as an isolation zone to constitute a light transmission path.

BRIEF DESCRIPTION OF THE DRAWINGS

FIGS. 1 and 2 are graphs showing variations of refractive indexes of plasma oxide films formed on GaP and $GaAs_{0.6}P_{0.4}$ according to the present invention, which are measured by ellipsometry, respectively;

FIG. 3 is a graph showing a relation between the refractive index and the thickness of the plasma oxide film when the film having a thickness of 3,000A or 5,000A is formed on GaP or $GaAs_{0.6}P_{0.4}$; and FIG. 4 is an illustrative view of an embodiment of the present invention when the plasma oxide film is formed on $GaAs_{0.6}P_{0.4}$ substrate for optical integrated circuit so as to constitute light transmission path.

DESCRIPTION OF THE PREFERRED EMBODIMENTS

According to the present invention, gallium phosphide (GaP) and gallium arsenide phosphide ($GaAs_{0.6}P_{0.4}$) are used as a substrate for an optical integrated circuit. Plasma oxidation of the substrate surface is carried out in an oxygen atmosphere of about 0.1 to 0.4 torr. A high frequency power supply is used to cause a white, bright light discharge to produce an insulating film on the substrate surface of a compound semiconductor. The thickness of the resulting insulating film may vary depending on the anode voltage of the high frequency oscillator and the oxygen pressure but is typically in the range of 100A to $10\mu$. Further details of the formation of insulating films by plasma oxidation may be had with reference to our prior co-pending Application Ser. No. 293,902, and the Continuation Application thereof, Ser. No. 508,606. The variation of refractive index of a plasma oxide film formed on the said substrate by plasma oxidation is as follows.

FIG. 1 shows the variation of the refractive index of the plasma oxide film formed on the GAP substrate as a function of the thickness of this film, wherein an abscissa indicates the thickness of the plasma oxide film on a log scale and an ordinate indicates the refractive index of such a film. In this figure, the solid line represents the refractive indexes of the plasma oxide film having different thicknesses as given in the abscissa, while a broken line represents the variation of the refractive index when the resulting oxide film is thinned by an etching. As seen from the comparison of the solid line and the broken line in FIG. 1, the refractive index of the oxide film gradually decreases from the boundary face between the substrate and the film to the outer surface of the film.

FIG. 2 shows the variation of the refractive index of the plasma oxide film formed on $GaAs_{0.6}P_{0.4}$ substrate. In the same way as described above, the refractive index of the oxide film gradually increases with increasing depth or thickness of the film as shown by the broken line.

In FIGS. 1 and 2, the refractive index of the oxide film was measured by the ellipsometry of separated light paths system ($\lambda=5,461A$) wherein $n(GaP)=3.565$, $k(GaP)=0.000069$, $n(GaAs_{0.6}P_{0.4})=3.840$ and $k(GaAs_{0.6}P_{0.4})=0.100$ were used as the optical constants of GaP and $GaAs_{0.6}P_{0.4}$. Furthermore, the etching of the oxide film was carried out by using a 5% HF solution at an etching rate of 500–1,000A/min.

FIG. 3 shows the variation of the refractive index of the plasma oxide film as a function of the depth or thickness thereof when the said oxide film is formed with a thickness of 3,000A or 5,000A on GaP or $GaAs_{0.6}P_{0.4}$ substrate by plasma oxidation. As seen from this figure, the refractive index of the oxide film increases near to the value of the refractive index of the substrate at the thickness of less than 100A. This is due to the fact that unbonded P and As, very poor crystalline $P_2O_3$, $P_2O_5$ and $As_2O_3$ and the like accumulate around the boundary face, and further oxygen ions generated by the plasma oxidation penetrate into the substrate.

Next, an embodiment of the present invention in which the plasma oxide film is selectively formed in a $GaAs_{0.6}P_{0.4}$ compound semiconductor layer so as to define light transmission paths in said layer will be explained with reference to FIGS. 4a–4c. The $GaAs_{0.6}P_{0.4}$ compound semiconductor layer forms light transmission paths.

FIG. 4a is a perspective view of a sample manufactured by plasma oxidation according to the present invention in which $GaAs_{0.6}P_{0.4}$ compound semiconductor layer 2 is epitaxially grown on GaAs substrate 1 and then plasma oxide films 3 are selectively formed to an extent that the films 3 arrive at the GaAs substrate 1.

FIG. 4b shows two-dimensionally the relation of refractive index in the plasma oxide film 3. As seen from FIG. 4b, the refractive index of the $GaAs_{0.6}P_{0.4}$ compound semiconductor layer 2 is constant ($n=3.840$), while the refractive index of the plasma oxide film 3 gradually decreases aparting from the boundary face with the layer 2 in the lateral direction.

FIG. 4c is a plan view of the sample and shows that when a light ray 4 penetrated in the sample enters into the oxide film 3, the light ray is bent inwardly because of the gradual decrease of the refractive index of the oxide film and finally propagated in the $GaAs_{0.6}P_{0.4}$ layer 2 forming the light transmission path in the longitudinal direction. In this case, the distance of the light entered into the oxide film is at most about 2 microns even when the angle of the light entered is 45°. Therefore, if the width of the oxide film is more than 10 microns, the greater part of the light is bent inwardly in the oxide film and again returned to the $GaAs_{0.6}P_{0.4}$ layer. Thus, the plasma oxide film constitutes isolation zones for light transmission.

Furthermore, the light path can optionally be bent by forming plasma oxide film with an approximate radius of curvature in the $GaAs_{0.6}P_{0.4}$ compound semiconductor layer.

As mentioned above, the present invention utilizes that the refractive index of the plasma oxide film selectively formed on the compound semiconductor gradually decreases from the boundary face in the direction of film thickness, whereby the isolation zone for light transmission, which is required for eliminating interaction between light transmission paths, may be formed in optical integrated circuit.

What is claimed is:

1. A compound semiconductor optical integrated circuit having isolation zones for light transmission comprising a compound semiconductor substrate selected from a group consisting of GaP and GaAs, a compound semiconductor layer of $GaAs_{0.6}P_{0.4}$ applied through an epitaxial growth on said substrate, and plasma oxide films in a given pattern in the compound semiconductor layer formed to a depth extending to the compound semiconductor substrate and forming isolation zones for light transmission, the compound semiconductor layer having a constant refractive index greater than the refractive index of the plasma oxide films and the refractive index of the oxide films gradually decreasing from the boundary with the compound semiconductor layer in the direction of oxide film inside, the compound semiconductor layer between the oxide films serving as a light transmission path.

* * * * *

UNITED STATES PATENT AND TRADEMARK OFFICE
CERTIFICATE OF CORRECTION

PATENT NO. : 4,015,893
DATED : April 5, 1977
INVENTOR(S) : TAKUO SUGANO ET AL

It is certified that error appears in the above—identified patent and that said Letters Patent is hereby corrected as shown below:

On the cover sheet   Item [30], Foreign Application Priority data "47-102280" should be -- 47-102282 --.

Signed and Sealed this

Thirtieth Day of March 1982

[SEAL]

Attest:

GERALD J. MOSSINGHOFF

Attesting Officer      Commissioner of Patents and Trademarks